(12) United States Patent
Sasaki et al.

(10) Patent No.: US 11,587,737 B2
(45) Date of Patent: Feb. 21, 2023

(54) MULTILAYER CERAMIC CAPACITOR, CIRCUIT SUBSTRATE AND MANUFACTURE METHOD THEREFOR

(71) Applicant: TAIYO YUDEN CO., LTD., Tokyo (JP)

(72) Inventors: Takashi Sasaki, Tokyo (JP); Tomohiko Zaima, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 135 days.

(21) Appl. No.: 16/998,800

(22) Filed: Aug. 20, 2020

(65) Prior Publication Data

US 2021/0057163 A1 Feb. 25, 2021

(30) Foreign Application Priority Data

Aug. 23, 2019 (JP) .............. JP2019-152529

(51) Int. Cl.
*H01G 4/30* (2006.01)
*H01G 4/012* (2006.01)
*H01G 2/06* (2006.01)
*H01G 4/12* (2006.01)
*H01G 4/008* (2006.01)

(52) U.S. Cl.
CPC .............. *H01G 4/30* (2013.01); *H01G 2/065* (2013.01); *H01G 4/008* (2013.01); *H01G 4/012* (2013.01); *H01G 4/1218* (2013.01)

(58) Field of Classification Search
CPC ........ H01G 4/012; H01G 4/008; H01G 4/224; H01G 4/248; H01G 4/30; H01G 4/38; H01G 4/1227; H01G 4/1245; H01G 4/065; H01G 4/0085; H01G 4/40; H01G 4/12; H01G 4/1218; H05K 1/0231

See application file for complete search history.

(56) References Cited

U.S. PATENT DOCUMENTS

| 2015/0109718 A1* | 4/2015 | Choi ................ H01G 4/30 174/258 |
| 2015/0116892 A1* | 4/2015 | Park ................ H01G 4/30 361/275.3 |
| 2016/0049250 A1* | 2/2016 | Ahn ................ H01G 4/12 361/301.4 |

(Continued)

FOREIGN PATENT DOCUMENTS

JP 2018-67562 A 4/2018

*Primary Examiner* — Michael P McFadden
(74) *Attorney, Agent, or Firm* — Chen Yoshimura LLP

(57) ABSTRACT

A multilayer ceramic capacitor includes a ceramic main including first internal electrodes each drawn out to and reaching a pair of end surfaces and second internal electrodes each drawn out to and reaching a pair of side surfaces. A pair of end-surface external electrodes are respectively provided on the pair of end surfaces to be connected to the first internal electrodes, and a pair of side-surface external electrodes are respectively provided on the pair of side surfaces to be connected to the second internal electrodes. Each of the second internal electrodes has drawn-out parts that extend from an electrode main part and reach the pair of side surfaces, and with respect to each of the pair of side surfaces, two or more of the drawn-out parts are provided to extend from the electrode main part and reach the side surface.

8 Claims, 11 Drawing Sheets

(56) References Cited

U.S. PATENT DOCUMENTS

| | | | |
|---|---|---|---|
| 2017/0032897 A1* | 2/2017 | Sasaki | H01G 4/30 |
| 2018/0108480 A1 | 4/2018 | Fujii et al. | |
| 2018/0158614 A1* | 6/2018 | Park | H01G 4/232 |
| 2018/0182550 A1* | 6/2018 | Sasaki | H01G 4/232 |
| 2018/0350521 A1* | 12/2018 | Oh | H01G 4/012 |

* cited by examiner

MULTILAYER CERAMIC CAPACITOR, CIRCUIT SUBSTRATE AND MANUFACTURE METHOD THEREFOR

BACKGROUND OF THE INVENTION

Technical Field

The present disclosure relates to a multilayer ceramic capacitor, a circuit substrate mounting the same, and a manufacture method for the multilayer ceramic capacitor.

Background Art

Patent Document 1 discloses a so-called three-terminal multilayer ceramic capacitor. That three-terminal multilayer ceramic capacitor has a first end-surface external electrode formed on a first end surface of a laminated body, a second end-surface external electrode formed on a second end surface, a first side-surface external electrode formed on a first side surface and a second side-surface external electrode formed on a second side surface. In such a three-terminal multilayer ceramic capacitor in general, it is possible to reduce distances between the external electrodes that have different polarities, thereby shortening current paths and reducing inductance.

RELATED ART DOCUMENT

Patent Document

Patent Document 1: Japanese Patent Application Laid-Open Publication No. 2018-67562

SUMMARY OF THE INVENTION

On the other hand, in the three-terminal multilayer ceramic capacitor, the side-surface external electrodes tend to become thick, making it difficult to control the overall size of the device. When the side-surface external electrodes become thick, the sizes of the laminated body (ceramic main body) are restricted, the overlapping areas between internal electrodes are not secured, and it becomes difficult to construct a large-capacitance, low-inductance configuration.

In view of the foregoing, the present invention aims to provide a multilayer ceramic capacitor having a low-inductance and a high-capacitance, a circuit substrate mounting such a capacitor, and a manufacture method for such a multilayer ceramic capacitor.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a multilayer ceramic capacitor, comprising: a ceramic main body having a pair of end surfaces respectively facing a first direction and a direction opposite to the first direction and a pair of side surfaces respectively facing a second direction that is perpendicular to the first direction and a direction opposite to the second direction, the ceramic main body including first internal electrodes each drawn out to and reaching the pair of end surfaces and second internal electrodes each drawn out to and reaching the pair of side surfaces, the first internal electrodes and the second internal electrodes being laminated alternately in a third direction that is perpendicular to the first and second directions; a pair of end-surface external electrodes respectively provided on the pair of end surfaces, the pair of end-surface external electrodes being each connected to the first internal electrodes; and a pair of side-surface external electrodes respectively provided on the pair of side surfaces, the pair of side-surface external electrodes being each connected to the second internal electrodes, wherein each of the second internal electrodes has an electrode main part that faces and overlaps with the first internal electrodes in the third direction, and drawn-out parts that extend from the electrode main part and reach the pair of side surfaces, and wherein in each of the second internal electrodes, with respect to each of the pair of side surfaces, two or more of the drawn-out parts are provided to extend from the electrode main part and reach the side surface.

With this structure, in each of the second internal electrodes, the plurality of drawn-out parts are provided with respect to each of the side surfaces. Due to this structure, as compared with the case of having one drawn-out part for each side surface, the drawn-out parts can be placed near the respective end surfaces. Thus, the distance along the first direction between the end surfaces and the drawn-out parts, which corresponds to the distance between the end-surface external electrodes and the side-surface external electrodes, can be made small, and therefore, the inductance can be reduced.

Moreover, the above-mentioned distance between the end surfaces and the drawn-out parts can be adjusted by the separation width between the drawn-out parts along the first direction. Therefore, there is no need to enlarge the width in the first direction of the drawn-out part in order to reduce the inductance. Thus, the width of the drawn-out part can be restricted, which can prevent the thickening of the side-surface external electrode that covers the drawn-out part. Because of this, the thickness of the side-surface external electrodes along the second direction can be reduced relative to the overall dimension of the multilayer ceramic capacitor along the second direction, thereby securing a sufficient width in the internal electrodes along the second direction. Thus, it is possible to realize a low-impedance, high-capacitance multilayer ceramic capacitor.

In the above-mentioned multilayer ceramic capacitor, in each of the second internal electrodes, with respect to each of the pair of side surfaces, two of the drawn-out parts may be provided to extend from the electrode main part and reach the side surface, and said two drawn-out parts may be separated from each other in the first direction by 100 μm or more.

With this structure, the distance between the end surfaces and the drawn-out parts along the first direction may be reduced without making the structure of the second internal electrodes complex. This enables a further reduction of the inductance.

In the above-mentioned multilayer ceramic capacitor, each of the pair of side-surface external electrodes may have electrode covering regions that respectively cover the plurality of drawn-out parts of the second internal electrodes and a connecting region that connects the electrode covering regions that are adjacent to each other in the first direction, and in each of the pair of side-surface external electrodes, a thickness of the connecting region along the second direction may be less than a thickness of the electrode covering regions along the second direction.

With this structure, at each side surface, the side-surface external electrode is formed integrally as a unitary piece.

Alternatively, in the above-mentioned multilayer ceramic capacitor, each of the pair of side-surface external electrodes may have a plurality of electrode covering regions that respectively cover the plurality of drawn-out parts of the second internal electrodes, and the plurality of electrode covering regions may be separated from each other along the first direction.

In another aspect, the present disclosure provides a circuit substrate, comprising: a mounting substrate having a mounting surface; a multilayer ceramic capacitor mounted on the mounting surface, the multilayer ceramic capacitor including: a ceramic main body having a pair of end surfaces respectively facing a first direction and a direction opposite to the first direction and a pair of side surfaces respectively facing a second direction that is perpendicular to the first direction and a direction opposite to the second direction, the ceramic main body including first internal electrodes each drawn out to and reaching the pair of end surfaces and second internal electrodes each drawn out to and reaching the pair of side surfaces, the first internal electrodes and the second internal electrodes being laminated alternately in a third direction that is perpendicular to the first and second directions; a pair of end-surface external electrodes respectively provided on the pair of end surfaces, the pair of end-surface external electrodes being each connected to the first internal electrodes; and a pair of side-surface external electrodes respectively provided on the pair of side surfaces, the pair of side-surface external electrodes being each connected to the second internal electrodes, wherein each of the second internal electrodes has an electrode main part that faces and overlaps with the first internal electrodes in the third direction, and drawn-out parts that extend from the electrode main part and reach the pair of side surfaces, and wherein in each of the second internal electrodes, with respect to each of the pair of side surfaces, two or more of the drawn-out parts are provided to extend from the electrode main part and reach the side surface.

In another aspect, the present disclosure provides a method for manufacturing a multilayer ceramic capacitor, comprising: forming a ceramic main body having a pair of end surfaces respectively facing a first direction and a direction opposite to the first direction and a pair of side surfaces respectively facing a second direction that is perpendicular to the first direction and a direction opposite to the second direction, the ceramic main body including first internal electrodes each drawn out to and reaching the pair of end surfaces and second internal electrodes each drawn out to and reaching the pair of side surfaces, the first internal electrodes and the second internal electrodes being laminated alternately in a third direction that is perpendicular to the first and second directions, wherein each of the second internal electrodes has an electrode main part that faces and overlaps with the first internal electrodes in the third direction, and drawn-out parts that extend from the electrode main part and reach the pair of side surfaces, and wherein in each of the second internal electrodes, with respect to each of the pair of side surfaces, two or more of the drawn-out parts are provided to extend from the electrode main part and reach the side surface; forming a pair of end-surface external electrodes respectively on the pair of end surfaces by coating a conductive paste on each of the pair of end surfaces, the pair of end-surface external electrodes being each connected to the first internal electrodes; and forming a pair of side-surface external electrodes respectively on the pair of side surfaces by coating a conductive paste on each of the pair of side surfaces, the pair of side-surface external electrodes being each connected to the plurality of drawn-out parts of the second internal electrodes.

According to the present disclosure, it is possible to provide a low-inductance, high-capacitance multilayer ceramic capacitor, a circuit substrate mounting the same, and a manufacture method for the same.

It is to be understood that both the foregoing general description and the following detailed description are exemplary and explanatory, and are intended to provide further explanation of the invention as claimed.

DETAILED DESCRIPTION OF EMBODIMENTS

Figure 1:
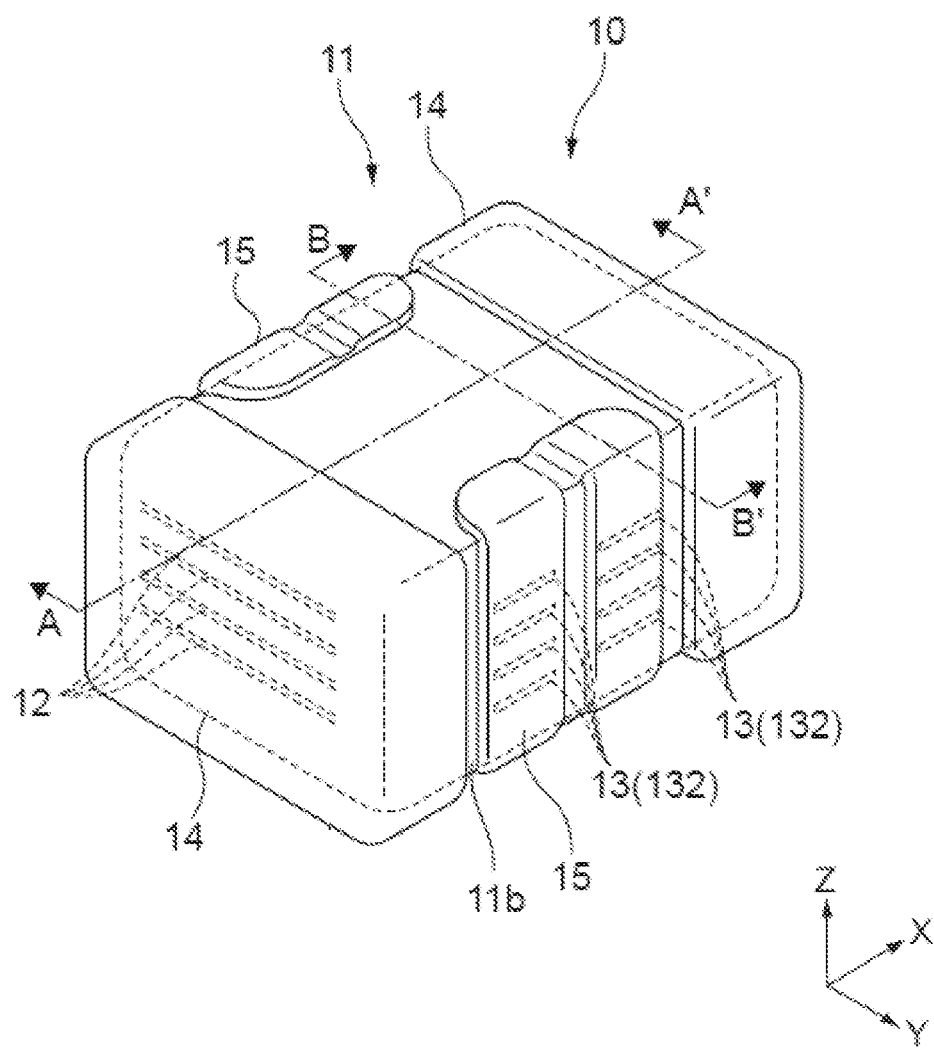
FIG. 1 is a perspective view of a multilayer ceramic capacitor according to Embodiment 1 of the present invention.

Various embodiments of the present invention will be described with reference to the drawings. In the drawings, the X-axis, Y-axis and Z-axis are shown when appropriate. These axes are oriented in the same manner throughout the drawings.

I. Embodiment 1

<1. Structure of Multilayer Ceramic Capacitor 1>

Figure 2:
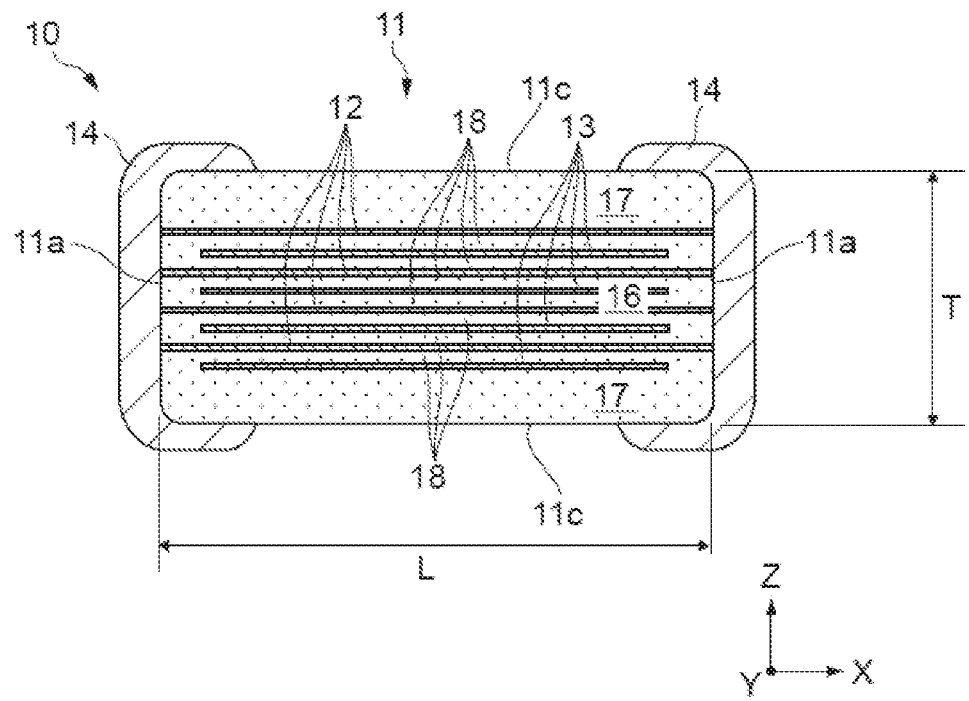
FIG. 2 is a cross-sectional view of the multilayer ceramic capacitor taken along the line A-A' of FIG. 1.
Figure 3:
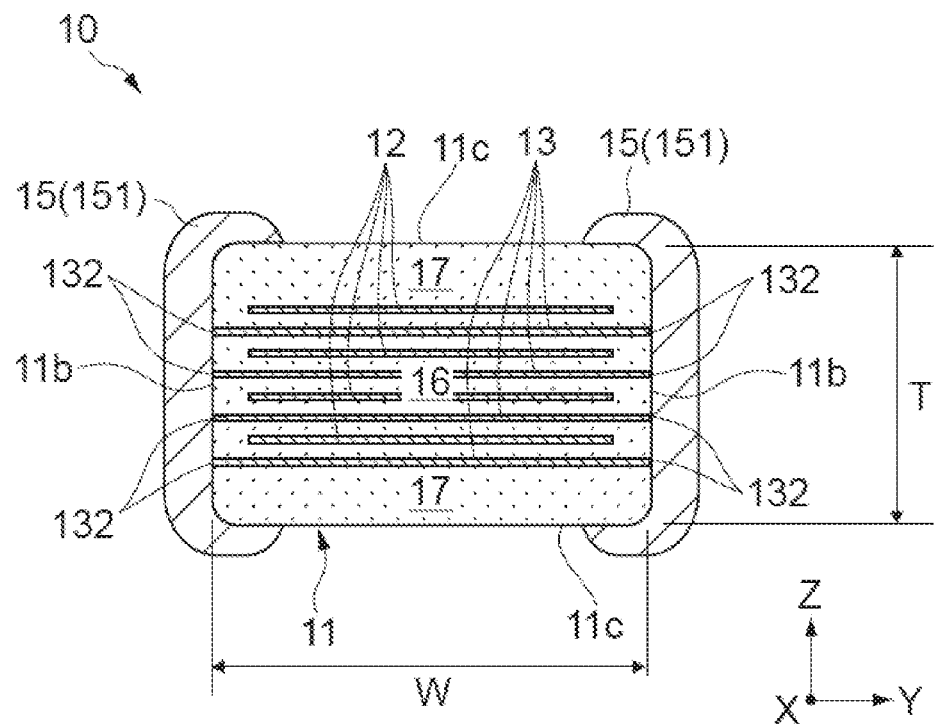
FIG. 3 is a cross-sectional view of the multilayer ceramic capacitor taken along the line B-B' of FIG. 1.

FIGS. 1-3 are drawings showing a multilayer ceramic capacitor 10 according to Embodiment 1 of the present disclosure. FIG. 1 is a perspective view of the multilayer ceramic capacitor 10. FIG. 2 is a cross-sectional view of the multilayer ceramic capacitor 10 taken along the line A-A' of FIG. 1. FIG. 3 is a cross-sectional view of the multilayer ceramic capacitor 10 taken along the line B-B' of FIG. 1.

The multilayer ceramic capacitor 10 is a three-terminal ceramic capacitor having a ceramic main body 11, a pair of end-surface external electrodes 14, and a pair of side-surface external electrodes 15. In the multilayer ceramic capacitor 10, for example, the end-surface external electrodes 14 may be through terminals and the side-surface external electrodes may be ground terminals.

The ceramic main body 11 has a generally cuboid shape overall. The ceramic main body 11 has a pair of end surfaces 11a opposite to each other along the X-axis, a pair of side surfaces 11b opposite to each other along the Y-axis, and a pair of main surfaces 11c opposite to each other along the Z-axis. Ridges connecting respective surfaces of the ceramic main body 11 are chamfered, but the present invention is not limited thereto. In FIG. 1, the ceramic main body 11 covered by the external electrodes 14 and 15 is shown by dotted lines.

The ceramic main body 11 has the length L in the X-direction, the width W in the Y-direction, and the height T in the Z-direction. The length L, width W, and height T are respectively the maximum dimensions in the X-direction, Y-direction, and Z-direction.

The width W of the ceramic main body 11 may be equal to or greater than 0.4 mm and equal to or less than 1.6 mm, for example. The length L of the ceramic main body 11 in the X-direction may be equal to or greater than 0.8 mm and equal to or less than 3.2 mm, for example. The height T of the ceramic main body 11 in the Z-direction may be equal to or greater than 0.4 mm and equal to or less than 1.6 mm, for example.

The end-surface external electrodes 14 are opposite to each other along the X-axis, and are provided on the end surfaces 11a, respectively. The end-surface external electrodes 14 are connected to first internal electrodes 12, which will be explained below, and have the same polarity. In this embodiment, the end-surface external electrodes 14 cover the end surfaces 11a and also extend from the end surfaces 11a to the main surfaces 11c and the side surfaces 11b.

The side-surface external electrodes 15 are respectively provided on the side surfaces 11b of the ceramic main body 11. Each of the side-surface external electrodes 15 is connected to second internal electrodes 13, which will be explained below, and has the same polarity that is different from the polarity of the end-surface external electrodes 14. In this embodiment, the side-surface external electrodes 15 extend from one of the main surfaces 11c to the other of the main surfaces 11c through the respective side surfaces 11b. The detailed structure of the side-surface external electrodes 15 will be provided below.

The external electrodes 14 and 15 are formed of a good electrically conductive material. Such a material may be a metal material having copper (Cu), nickel (Ni), tin (Sn), palladium (Pd), platinum (Pt), silver (Ag), or gold (Au) as its main component, or an alloy of these materials.

The ceramic main body 11 includes a laminated body 16 and cover parts 17. The laminated body 16 has a structure in which first internal electrodes 12 and second internal electrodes 13 are alternately laminated in the Z-direction with ceramic layers 18 in between. The cover parts 17 respectively cover the top and bottom surfaces, along the Z-axis, of the laminated body 16.

The internal electrodes 12 and 13 are made of a metallic material having a good electrical conductivity. Such a material may be a metal having nickel (Ni) as its main component or its alloy. The number of layers of the internal electrodes 12 and 13 are not specifically limited; for example, several tens of sheets or several hundreds of sheets may be provided.

Figure 4:
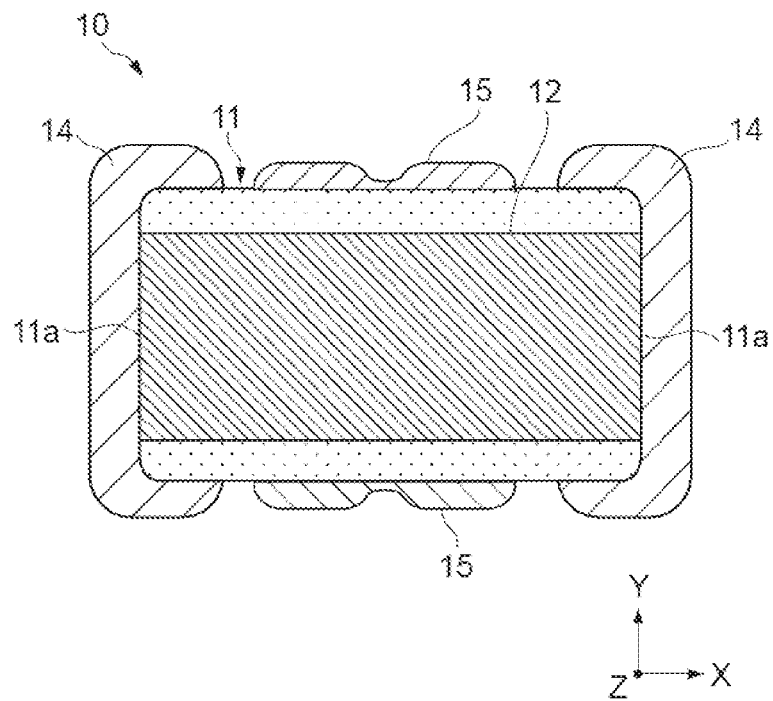
FIG. 4 is a cross-sectional view of the multilayer ceramic capacitor, cutting the first internal electrode by a plane parallel to the X-Y plane.

FIG. 4 is a cross-sectional view cutting the first internal electrode 12 by a plane parallel to the X-Y plane. As shown in FIG. 4, the first internal electrode 12 has a band shape spanning the entire dimension along the X-axis of the ceramic main body 11. Each of the first internal electrodes 12 is drawn out to the pair of end surfaces 11a, and are connected to the pair of end-surface external electrodes 14.

Figure 5:
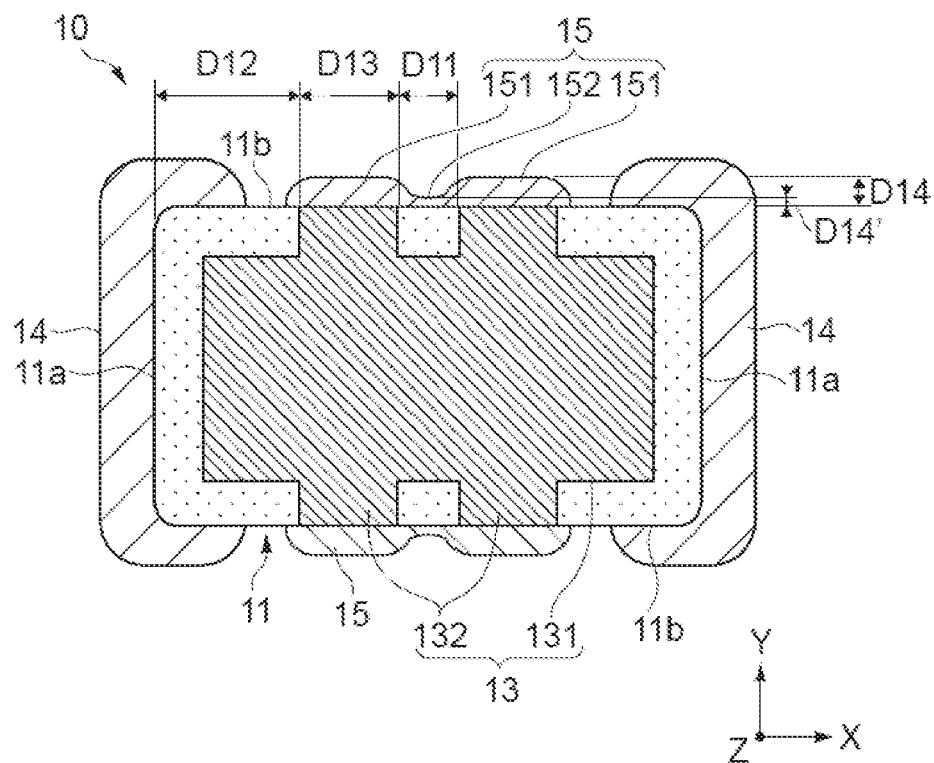
FIG. 5 is a cross-sectional view of the multilayer ceramic capacitor, cutting the second internal electrode by a plane parallel to the X-Y plane.

FIG. 5 is a cross-sectional view cutting the second internal electrode 13 by a plane parallel to the X-Y plane. The second internal electrode 13 faces the first internal electrodes 12 along the Z-axis via ceramic layers 18. Each of the second internal electrodes 13 is drawn to the pair of side surfaces 11b so as to be connected to the pair of side-surface external electrodes 15. The detailed structure of the second internal electrode 13 will be explained below.

In the multilayer ceramic capacitor 10, when voltage is applied between the end-surface external electrodes 14 and the side-surface external electrodes 15, the voltage is applied to a plurality of ceramic layers 18 between the first internal electrodes 12 and the second internal electrodes 13. Because of this, in the multilayer ceramic capacitor 10, electric charges corresponding to the voltage between the end-surface external electrodes 14 and the side-surface external electrodes 15 are stored.

Here, the material for the ceramic layers 18 between the internal electrodes 12 and 13 may be a perovskite material that includes barium (Ba) and titanium (Ti), exemplified by barium titanate ($BaTiO_3$). Alternatively, the ceramic layers 18 may be made of the strontium titanate ($SrTiO_3$) system; the calcium titanate ($CaTiO_3$) system; the magnesium titanate ($MgTiO_3$) system; the calcium zirconate ($CaZrO_3$) system; the calcium titanate zirconate ($Ca(Zr, Ti)O_3$) system; the barium zirconate ($BaZrO_3$) system; and the titanium dioxide ($TiO_2$) system instead.

Here, the cover parts 17 are also made of dielectric ceramic. The material for the cover part 17 may be insulating ceramic, and is preferably made of the same material as that for the ceramic layers 18 so as to suppress internal stress in the ceramic main body 11.

<2. Structure of Second Internal Electrodes 13>

As shown in FIG. 5, the second internal electrode 13 includes the electrode main part 131 and a plurality of drawn-out parts 132.

The electrode main part 131 faces the internal electrodes 12 along the Z-axis and is positioned at the center in the X-Y plane of the ceramic main body 11. The width dimension of the electrode main part 131 along the Y-axis is about the same as the with dimension of the first internal electrode 12 along the Y-axis.

The drawn-out parts 132 extend from the electrode main part 131 to each of the pair of side surfaces 11b. Because of this, the lateral edges of the drawn-our parts 132 are exposed on the side surfaces 11b of the ceramic main body 11. The drawn-out parts 132 are provided in a plurality for each of the pair of side surfaces 11b; two of them are provided with respect to each of the side surfaces 11b, for example. That is, a total of four (4) drawn-out parts 132 are provided in the second internal electrode 13, as shown in FIG. 5. The plurality of drawn-out parts 132 extending to the same side surface 11b are separated along the X-axis.

As shown in FIG. 5, with respect to the second internal electrode 13, the separation width D11, the distance D12 and the width D13 are defined. The separation width D11 is the distance along the X-axis between the adjacent drawn-out parts 132. The distance D12 is the distance along the X-axis from the end surface 11a to the drawn-out part 132. The width D13 is the width along the X-axis of each of the drawn-out parts 132.

Because the plurality of drawn-out parts 132 that are drawn out to each of the side surfaces 11b are separated along the X-axis, the equivalent series inductance (ESL: Equivalent Series Inductance) of the multilayer ceramic capacitor 10 can be decreased.

Figure 6:
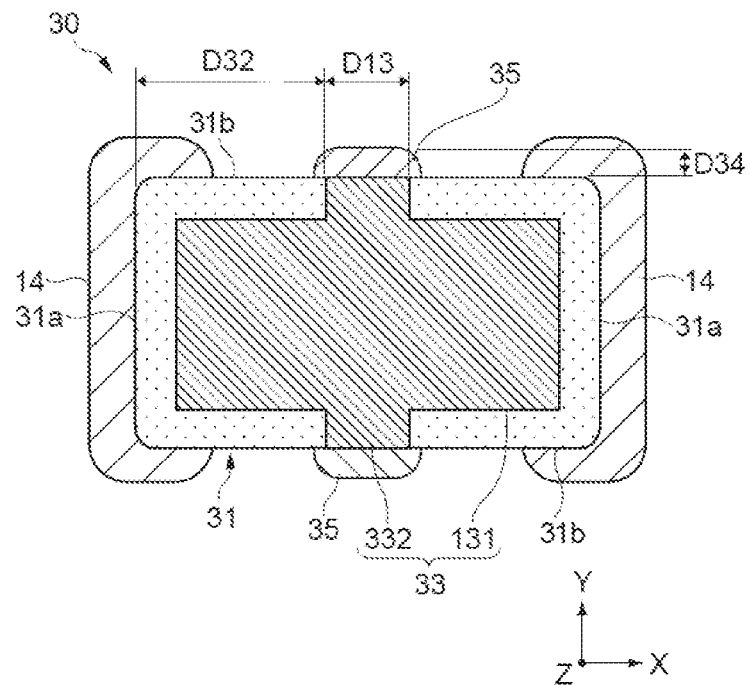
FIG. 6 shows a multilayer ceramic capacitor according to a first comparison example, showing a cross section at a position similar to FIG. 5.

FIG. 6 shows a multilayer ceramic capacitor 30 according to a first comparison example 30, showing a cross section in a position similar to FIG. 5. In the multilayer ceramic capacitor 30, elements having the same configurations as those of the multilayer ceramic capacitor 10 are assigned the same reference characters/numerals, and their explanations are omitted.

The multilayer ceramic capacitor 30 of the first comparison example includes a ceramic main body 31 that has first internal electrodes 12 and second internal electrodes 33, end-surface external electrodes 14, and side-surface external electrodes 35. That is, the multilayer ceramic capacitor 30 differs from the multilayer ceramic capacitor 10 with respect to the configuration of the second internal electrodes 33 and the side-surface external electrodes 35. Below, the length L, the width W, and the height T of the ceramic main body 31 are assumed to be the same as those of the ceramic main body 11.

The second internal electrode 33 includes the electrode main part 131 and drawn-out parts 332 that are provided one for each of the side surfaces 31b. The widths D13 along the X-axis of the drawn-out parts 332 are the same.

In the first comparison example, only one drawn-out part 332 is provided at the center along the X-axis for each of the side surfaces 31b. Because of this, in the first comparison example, the distance D31 along the X-axis from the end surface 31a to the drawn-out part 332 becomes greater than the distance D12 of Embodiment 1 in which the drawn-out part 132 is arranged closer to the end surface 11a. These distances D12 and D32 correspond to distances between the end-surface external electrodes and the side-surface external electrodes, and therefore have positive correlations to the effective length of the current paths in the first internal electrodes and second internal electrodes. That is, the shorter the distances D12/D32, the shorter the current path length, thereby reducing the ESL.

Therefore, the ESL of the multilayer ceramic capacitor 10 that has a shorter distance D12 is smaller than the ESL of the multilayer ceramic capacitor 30 having the greater distance D32. That is, in the multilayer ceramic capacitor 10 of Embodiment 1, due to the plurality of drawn-out parts 132 for each of the side surfaces 11b, the ESL can be lowered as compared with the multilayer ceramic capacitor 30 of the first comparison example.

Further, in this embodiment, the separation width D11 may be se to be equal to or greater than 100 μm so that the distance D12 may be set to equal to or less than 400 μm, thereby further reducing the ESL. Moreover, the ratio D11/L which is a ratio of the separation width D11 to the length L of the ceramic main body 11, may be equal to or greater than 0.05.

When two drawn-out parts 132 are drawn out to each of the side surfaces 11b, the two drawn-our parts 132 may be separated along the X-axis by 100 μm or greater. That is, the separation width D11 between the two drawn-out parts 132 may be equal to or greater than 100 μm. With this structure, the ESL may be lowered without having a complicated structure in the drawn-out part 132.

<Structure of Side-Surface External Electrodes 15>

As shown in FIG. 5, the side-surface external electrode 15 of Embodiment 1 includes a plurality of electrode covering regions 151 respectively covering the plurality of drawn-out parts 132 at each of the pair of side surfaces 11b, and a connection region 152 that connects the electrode covering regions 151 that are adjacent to each other in the X-direction. That is, in each of the side-surface external electrodes 15, the plurality of electrode covering regions 151 are connected by the connecting region 152, thereby forming a unitary electrode.

Each of the electrode covering regions 151 covers a column of the drawn-out parts that are laminated in the Z-direction, and extends in the Z-direction from one of the main surfaces 11c to the other of the main surfaces 11c through the side surface 11b. The connecting region 152 is positioned between the electrode covering regions 151 that are adjacent to each other in the X-direction, and similar to the electrode covering regions 151, extends in the Z-direction from one of the main surfaces 11c to the other of the main surfaces 11c through the side surface 11b.

The thickness along the Y-axis of the connecting region 152 is less than the thickness along the Y-axis of the electrode covering regions 151. In other words, defining the thickness along the Y-axis of the electrode covering regions 151 as the electrode thickness D14, and defining the thickness along the Y-axis of the connecting region 152 as the connecting region thickness D14', the connection region thickness D14' is less than the electrode thickness D14. The electrode thickness D14 is the maximum thickness along the Y-axis of the electrode covering regions 151. The connecting region thickness D14' is the thickness along the Y-axis of the connecting region 152 at the center point along the X-axis between the drawn-out parts 132 that are adjacent to each other.

Furthermore, the electrode thickness D14 of the electrode covering regions 151 becomes about the same as or less than the electrode thickness D34 along the Y-axis of the side-surface external electrode 35 in the first comparison example of FIG. 6. Because of this, as will be explained with reference to second comparison example below, in the multilayer ceramic capacitor 10 of Embodiment 1, a lower ESL and a thinning of the electrode covering regions 151 can be achieved.

Figure 7:
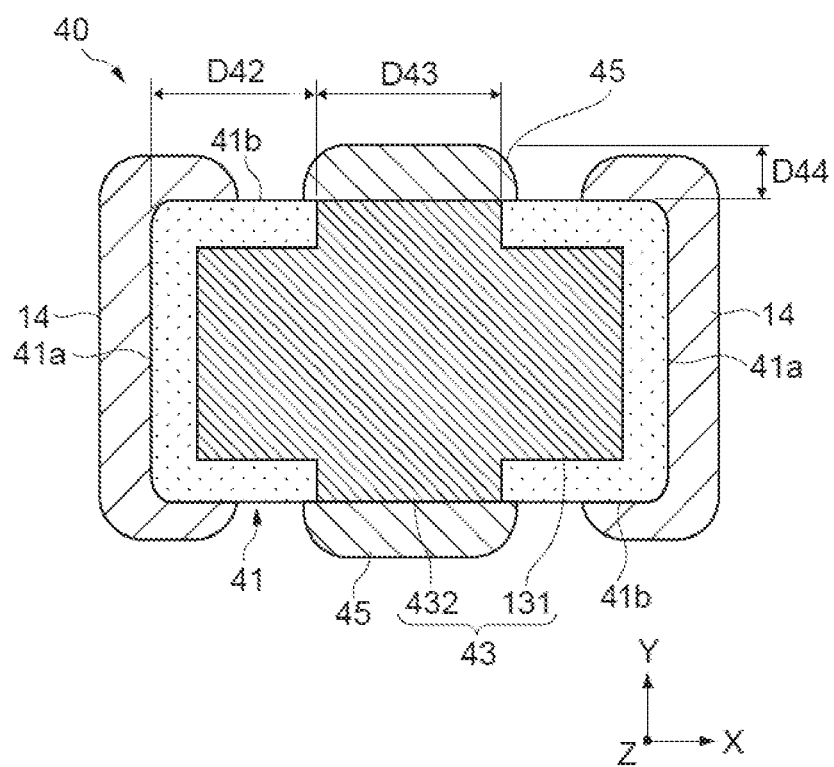
FIG. 7 shows a multilayer ceramic capacitor according to a second comparison example, showing a cross section at a position similar to FIG. 5.

FIG. 7 shows a multilayer ceramic capacitor 40 according to a second comparison example, and shows a cross section in a position similar to FIG. 5. In the multilayer ceramic capacitor 40, elements having the same configurations as those of the multilayer ceramic capacitor 10 are assigned the same reference characters/numerals, and their explanations are omitted.

The multilayer ceramic capacitor 40 of the second comparison example includes a ceramic main body 41 having first internal electrodes 12 and second internal electrodes 43, end-surface external electrodes 14, and side-surface external electrodes 45. That is, the multilayer ceramic capacitor 40 differs from the multilayer ceramic capacitor 10 in that the internal electrodes 43 and the side-surface external electrodes 45 have different structures from those of the multilayer ceramic capacitor 10. Below, the length L, the width W, and the height T of the ceramic main body 41 are assumed to be the same as those of the ceramic main body 11.

The second internal electrode 43 has an electrode main part 131 and a wider drawn-out part 432 that is provided one for each of the side surfaces 41b. The width D43 along the X-axis of each of the drawn-out parts 432 is greater than the width D13 of each of the drawn-out parts 132. The greater the width D43, the smaller the distance D42 from the end surface 41a to the drawn-out part 432. Therefore, in the multilayer ceramic capacitor 40, the ESL is lowered by making the width D43 of the drawn-out parts 432 greater.

The side-surface external electrodes 45 are formed so as to cover the entirety of the wider drawn-out parts 432. The side-surface external electrodes 15/45 are formed by coating a conductive paste on the side surfaces 11b/41b, respectively, as will be explained below. On the drawn-out parts 132/432, which are made of conductive metal, the wettability of the conductive paste is low, and therefore, the conductive paste bulges outwardly in the Y-direction due to surface tension. Because of this, the greater the width D13/D43 of the drawn-out parts 132/432, the farther the conductive paste bulges outwardly in the Y-direction, making the conductive paste thicker.

Accordingly, the electrode thickness D44 along the Y-axis of the side-surface external electrodes 45 become greater than the thickness D14 of the electrode covering region 151 of Embodiment 1. That is, in the multilayer ceramic capacitor 40 of the second comparison example, if the distance D42 is made smaller so as to reduce the ESL, the width D43 must be made larger. This results in a greater electrode thickness D44. When the electrode thickness D44 is large, the side-surface external electrodes 45 occupy larger parts in the entire width dimension along the Y-axis of the multilayer ceramic capacitor 40. Because of this, the width W of the ceramic main body 41 would have to become relatively small, and it is difficult to increase the static capacitance.

In the multilayer ceramic capacitor 10 of Embodiment 1, the distance D12 that is related to the ESL may be adjusted by not only the width D13, but also the separation width D11. Because of this, in the multilayer ceramic capacitor 10, by securing the separation width D11, the width D13 of the drawn-out parts 132 can be regulated and the distance D12 can be made small, thereby lowering the ESL.

Further, in the present embodiment, by making small the width D13 of the drawn-out parts 132, the bulging of the conductive paste on each drawn-out part 132 can be suppressed, thereby making the electrode thickness D14 of the electrode covering regions 151 small. Thus, the width W of the ceramic main body 11 can occupy a larger portion of the entire width along the Y-axis of the multilayer ceramic capacitor 10. Therefore, without making the size of the multilayer ceramic capacitor 10 larger, the sufficient width dimensions of the internal electrodes 12 and 13 can be secured, and the static capacitance can be increased.

For example, by making the width D13 equal to or less than 300 μm, the electrode thickness D14 can be made to be equal to or less than 20 μm, and as a result, miniaturization and a large capacitance of multilayer ceramic capacitor 10 can be realized.

In view of the foregoing, in the multilayer ceramic capacitor 10, the ESL can be reduced, and miniaturization and a large capacitance can be realized. Such a multilayer ceramic capacitor 10 can be mounted on a mounting substrate 50 shown below, thereby constituting a circuit substrate 100.

<4. Structure of Circuit Substrate>

Figure 8:
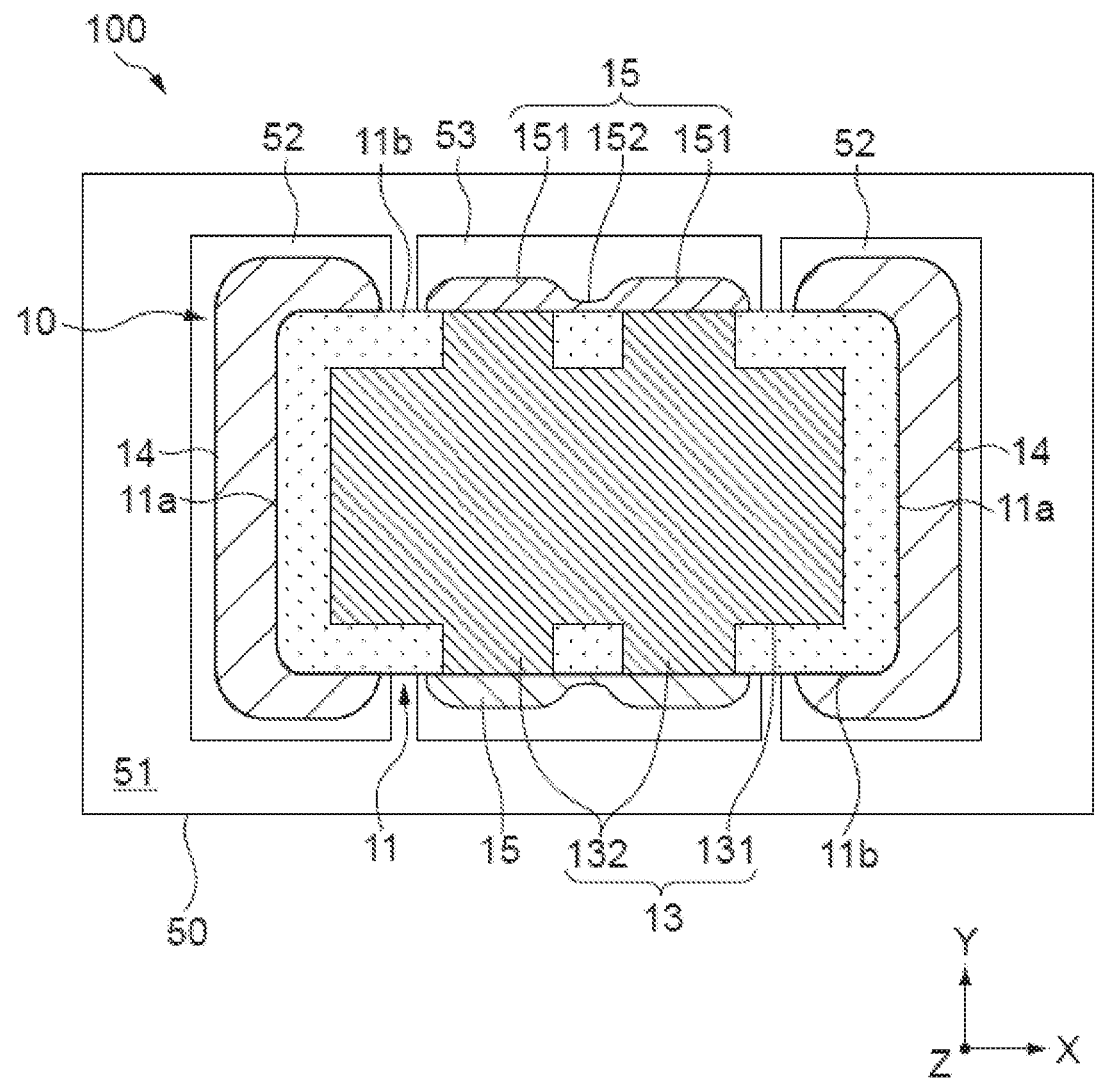
FIG. 8 shows a circuit substrate mounting the multilayer ceramic capacitor, showing a cross section at a position similar to FIG. 5.

FIG. 8 is a cross-sectional view showing a structure of a circuit substrate 100 according to the present embodiment, and shows a cross section in a position similar to FIG. 5. The circuit substrate 100 includes a mounting substrate 50 having a mounting surface 51 and the multilayer ceramic capacitor 10 mounted on the mounting surface 51.

The mounting surface 51 includes first lands 52 respectively connected to the end-surface external electrodes 14 and a second land 53 connected to the side-surface external electrodes 15. In the example shown in FIG. 8, the mounting surface 51 has two first lands 52 and one second land 53 for a single multilayer ceramic capacitor 10.

The first lands 52 are formed so as to respectively correspond to the pair of end-surface external electrodes 14, and have a planar shape, in a plan view as seen in the negative Z-direction, covering the entire end-surface external electrodes 14, respectively. The second land 53 has a planar shape, in the plan view as seen in the negative Z-direction, covering both pair of side-surface external electrodes 15. That is, to the single second land 53, both of side-surface external electrodes 15 are connected. However, the present invention is not limited thereto. For example, for a single multilayer ceramic capacitor 10, two second lands 53 may be provided so that one side-surface external electrode 15 is connected to one corresponding second land 53.

The external electrodes 14 and 15 are connected to the lands 52 and 53 via a solder, for example, which is not shown in the figure. By the solder, the multilayer ceramic capacitor 10 is electrically connected to the mounting substrate 50, and voltage is applied to the external electrodes 14 and 15 via the lands 52 and 53.

In the circuit substrate 100, when voltage is applied to the external electrodes 14 and 15 via the mounting substrate 50, the ESL generated in the multilayer ceramic capacitor 10 can be lowered. Further, in the circuit substrate 100, because the side-surface external electrodes 15 can be made thinner, the static capacitance of the multilayer ceramic capacitor 10 can be increased without expanding the mounting space of the multilayer ceramic capacitor 10.

<5. Manufacture Method of Multilayer Ceramic Capacitor 10>

Figure 9:
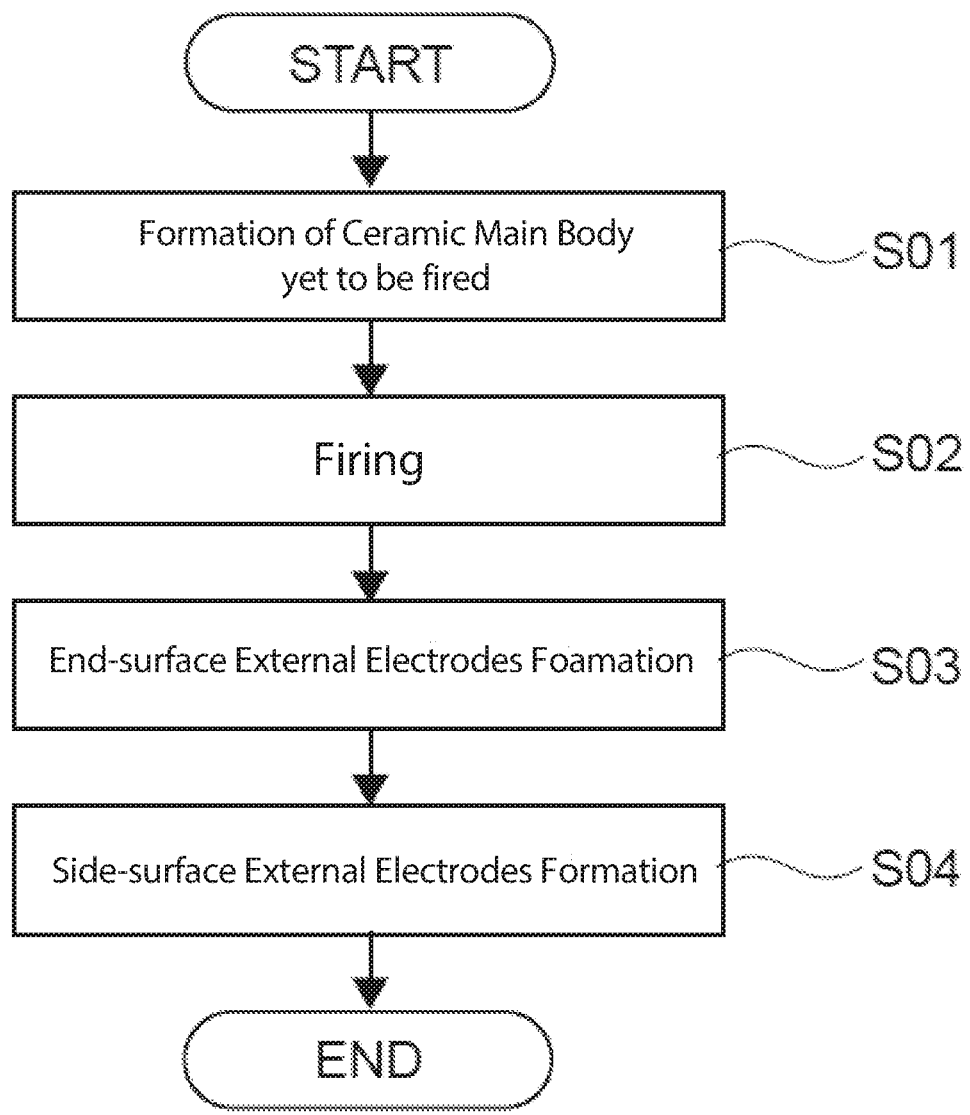
FIG. 9 is a flowchart showing a manufacture method of the multilayer ceramic capacitor.
Figure 10:
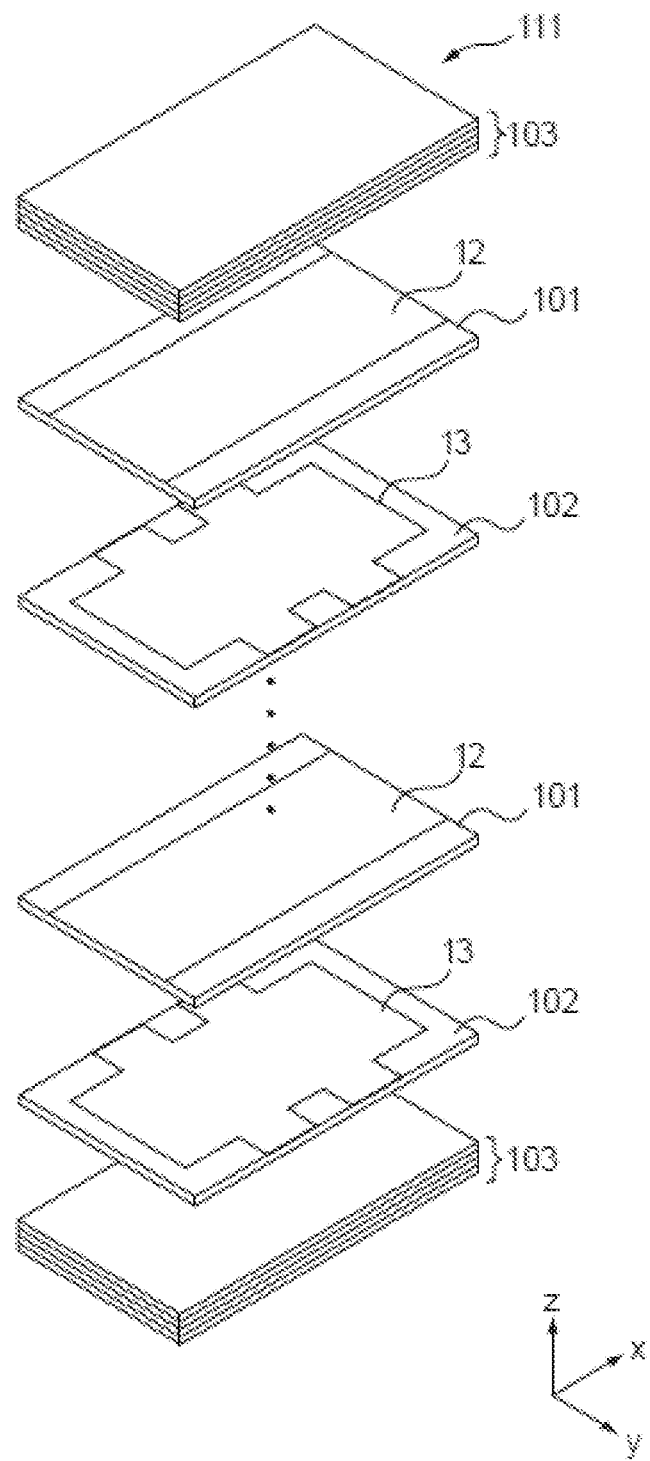
FIG. 10 is a perspective view schematically showing a manufacture process of the multilayer ceramic capacitor.
Figure 11:
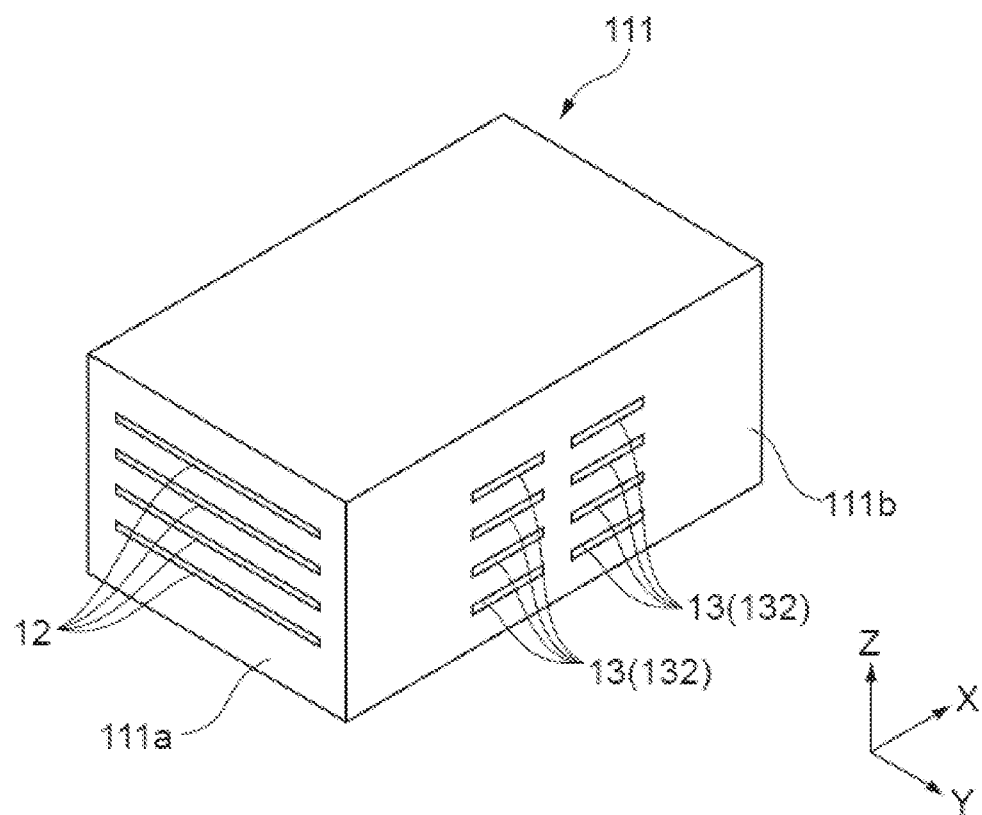
FIG. 11 is a perspective view schematically showing a manufacture process of the multilayer ceramic capacitor.

FIG. 9 is a flowchart showing a manufacture method of the multilayer ceramic capacitor 10. FIGS. 10 and 11 schematically show manufacturing processes of the manufacture method of the multilayer ceramic capacitor 10. Below, the manufacture method of the multilayer ceramic capacitor 10 will be explained with reference to FIGS. 10 and 11.

<5.1 Step S01: Formation of Ceramic Main Body 111 Yet to be Fired>

At step S01, ceramic sheets 101, 102 and 103 are laminated, as shown in FIG. 10, so as to form a ceramic main body 111 which is yet to be fired, as shown in FIG. 11.

The ceramic sheets 101, 102, and 103 are dielectric green sheets, which are yet to be fired, having dielectric ceramic as the main component. On the first ceramic sheets 101, the first internal electrodes 12 yet to be fired are respectively formed. On the second ceramic sheets 102, the second internal electrodes 13 yet to be fired are respectively formed. The first ceramic sheets 101 and the second ceramic sheets 102 are laminated alternately in the Z-direction. The resulting laminate of the ceramic sheets 101 and 102 corresponds to the laminated body 16 yet to be fired. On the top and bottom, along the Z-axis, of the laminate of the ceramic sheets 101 and 102, third ceramic sheets 103 on which no internal electrode is formed are laminated. The laminates of the third ceramic sheets 103 correspond to the cover parts 17, which are yet to be fired.

The laminated ceramic sheets 101, 102, and 103 are pressure-joined to form a single unit. As a result, the ceramic main body 11 yet to be fired shown in FIG. 11 is manufactured. For the pressure-joining, hydrostatic pressurization or uniaxial pressurization may be used.

As shown in FIG. 11, in the ceramic main body 111, lateral edges of the first internal electrodes 12 are exposed on end surfaces 111a, and lateral edges of the drawn-out parts 132 of the second internal electrodes 13 are exposed on the side surfaces 111b. In particular, in this embodiment, on each of the side surfaces 111b, lateral edges of two drawn-out parts 132 of each second internal electrode 13 are exposed.

Here, although the above explanation is provided for the ceramic main body 111 yet to be fired that corresponds a single ceramic main body 11, in actuality, large mother laminated sheets are formed first and are separated into a plurality of individual ceramic main bodies 111.

<5.2 Step S02: Firing>

At step S02, the ceramic main body 111 that has been obtained in step S01 is sintered to form the ceramic main body 11 shown in FIGS. 1-5. The firing may be performed in a reducing atmosphere or low oxygen partial pressure atmosphere. Here, after firing the ceramic main body 111 yet to be fired, a barrel polishing may be performed for chamfering.

<5.3 Step S03: End-Surface External Electrodes 14 Formation>

At step S03, the end-surface external electrodes 14 are formed on the end surfaces 11a. The end-surface external electrodes 14 are formed by applying a conductive paste on the end surfaces 11a by an appropriate method, such as a dipping method, printing method, and by baking it. The conductive paste may include a metallic material (copper or nickel, etc., for example) as the main component as well as glass components, resin and/or organic solvent components and the like.

<5.4 Step S04: Side-Surface External Electrodes 15 Formation>

At step S04, the side-surface external electrodes 15 are formed on the side surfaces 11b. The side-surface external electrodes 14 are formed by applying a conductive paste on the end surfaces 11a by a roll-transfer method, screen printing method or the like and by baking it. As the conductive paste, the conductive paste used for the formation of the end-surface electrodes 14 may be used.

The baking of the conductive paste for the side-surface external electrodes 15 may be performed at the same time as the baking for the end-surface external electrodes 14. Alternatively, before step S02, the conductive paste for forming the end-surface external electrodes 14 and the side-surface external electrodes 15 may be applied to the ceramic main body 111 yet to be fired, and at the firing step S02, the external electrodes 14 and 15 and the ceramic main body 111 yet to be fired may be fired at the same time.

The conductive paste for forming the side-surface external electrodes 15 may be applied to form patterns that correspond to the respective electrode covering regions 151. That is, the conductive paste may be applied such that at each of the side surfaces 11b, a plurality of band shape patterns of the conductive paste are arranged in the X-direction so as to respectively cover the drawn-out parts 132 laminated in the Z-direction. In that case, the patterns of the conductive paste adjacent to each other in the X-direction expand laterally along the X-axis due to wetting. As a result, the connecting region 152 is formed.

Alternatively, the conductive paste for forming the side-surface external electrodes 15 may be formed to cover a plurality of drawn-out parts 132 arranged along the X axis and regions therebetween. That is, the conductive paste may be formed such that at each of the side surfaces 11b, a single band shape pattern of the conductive paste covers columns of the plurality of drawn-out parts 132 laminated in the Z-direction.

Here, the contact angle of the conductive paste on the exposed lateral edges of the drawn-out part 132 is typically greater than that on the exposed lateral edges of the ceramic layers 18. That is, the conductive paste bulges greatly on regions of the drawn-out parts 132, and tends to expand laterally due to wetting and become thinner on the ceramic layers 18 that are between the drawn-out parts 132 that are adjacent to each other in the X-direction. Therefore, by applying the conductive paste on the plurality of drawn-out parts 132 and on the ceramic layers 18 in between that are exposed on the side surface 11b, after the application, relatively thicker electrode covering regions are formed on the drawn-out parts 132, and a thin connecting region 152 is formed on the ceramic layers 18 between the drawn-out parts 132.

Further, because of the relatively large contact angle of the conductive paste on the exposed drawn-out parts 132, the larger the width D13 of the drawn-out part 132, the greater the degree to which the conductive paste bulges on the drawn-out part 132, therefore creating a thicker conductive paste. Because of this, as in the multilayer ceramic capacitor 40 of the second comparison example shown in FIG. 7, when the width D43 of the drawn-out part 432 is configured to be large, the electrode thickness D44 of the conductive paste tends to become large.

In the multilayer ceramic capacitor 10 of the present embodiment, a plurality of drawn-out parts 132 having a relatively small width D13 are provided and are separated along the X-axis. Due to this structure, the drawn-out parts 132 can be positioned closer to the end surfaces 11a, thereby making small the distance D12 from the end surface 11a to the drawn-out part 132, and at the same time, the electrode thickness D14 of the side-surface external electrode 15 (the electrode covering regions 151) can be made small. Therefore, according to the present embodiment, a low ESL, miniaturized, and high-capacitance multilayer ceramic capacitor 10 can be obtained.

<6. Working Example>

As an example of Embodiment 1, a Working Example was manufactured using the above-described manufacture method. In Working Example, each internal electrode 13 has two drawn-out parts 132 with respect to each of the side surfaces 11b, and the separation width D11 between the two adjacent drawn-out parts 132 was set to 300 μm. In Working Example, the length L along the X-axis of the ceramic main body 11 was 1.6 mm; the width W along the Y-axis of the ceramic main body 11 was 0.8 mm; the distance D12 from the end surface 11a to the drawn-out part 132 was 390 μm; the width D13 of the drawn-our part 132 was 260 μm; and the electrode thickness D14 of the side-surface external electrode 15 (the electrode covering region 151) was 20 μm.

As Comparison Example 1, a sample of the multilayer ceramic capacitor of the first comparison example shown in FIG. 6 was manufactured. That is, in Comparison Example 1, each internal electrode 33 has one relatively narrow drawn-out part 332 with respect to each of the side surfaces 31b. In this Comparison Example 1, the length L along the X-axis of the ceramic main body 11 was 1.6 mm; the width W along the Y-axis of the ceramic main body 11 was 0.8 mm; the distance D32 from the end surface 31a to the drawn-out part 332 was 670 μm; the width D13 of the drawn-out part 332 was 260 μm; and the electrode thickness D34 of the side-surface external electrode 35 was 20 μm.

As Comparison Example 2, a sample of the multilayer ceramic capacitor of the second comparison example shown in FIG. 7 was manufactured. That is, in this Comparison Example 2, each internal electrode 43 has one relatively wide drawn-out part 432 with respect to each of the side surfaces 41b. In this Comparison Example 2, the length L along the X-axis of the ceramic main body 11 was 1.6 mm; the width W along the Y-axis of the ceramic main body 11 was 0.8 mm; the distance D42 from the end surface 41a to the drawn-out part 432 was 600 µm; the width D43 of the drawn-out part 432 was 400 µm; and the electrode thickness D44 of the side-surface external electrode 45 was 25 µm.

As Comparison Example 3, a sample of the multilayer ceramic capacitor of the first comparison example shown in FIG. 6 having dimensions different from those of Comparison Example 1 was manufactured. That is, in this Comparison Example 3, each internal electrode 33 has one drawn-out part 332 with respect to each of the side surfaces 31b. In this Comparison Example 3, the length L along the X-axis of the ceramic main body 11 was 1.14 mm; the width W along the Y-axis of the ceramic main body 11 was 0.85 mm; the distance D32 from the end surface 31a to the drawn-out part 332 was 440 µm; the width D13 of the drawn-out part 332 was 260 µm; and the electrode thickness D34 of the side-surface external electrode 35 was 20 µm.

As Comparison Example 4, a sample of the multilayer ceramic capacitor of the first comparison example shown in FIG. 6 having dimensions that are different from those of Comparison Examples 1 and 3 was manufactured. That is, in this Comparison Example 4, each internal electrode 33 has one drawn-out part 332 with respect to each of the side surfaces 31b. In this Comparison Example 3, the length L along the X-axis of the ceramic main body 11 was 1.3 mm; the width W along the Y-axis of the ceramic main body 11 was 0.995 mm; the distance D32 from the end surface 31a to the drawn-out part 332 was 520 µm; the width D13 of the drawn-out part 332 was 260 µm; and the electrode thickness D34 of the side-surface external electrode 35 was 20 µm.

Working Example and Comparison Examples 1-4 were mounted on mounting substrates having mounting surfaces, respectively, to create samples of circuit substrates, respectively. Voltage was applied to respective external electrodes through the lands of the respective circuit substrates so as to measure the ESL values. Specifically, voltage was applied to respective external electrodes, and using a network analyzer (made by Agilent), the ESL value at a frequency of 25 MHz was measured for each sample.

The results showed that in Comparison Examples 1, 3, and 4, which correspond to the first comparison example, the ESL values were 35.0 pH, 21.4 pH, and 24.5 pH, respectively. On the other hand, in Comparison Example 2, which corresponds to the second comparison example, the ESL value was 31.3 pH. These results confirmed that the shorter the distance from the end surface to the drawn-out part, the smaller the ESL value.

In contrast, in Working Example, the ESL value was 17.9 pH, which is smaller than the values of Comparison Examples 1-4.

Therefore, it was verified that in Working Example, the distance from the end surface 11a to the drawn-out part 132 can be made shorter than those of Comparison Examples 1-4, thereby lowering the ESL value. Further, it was verified that the width of the drawn-out parts 132 can be formed to have about the same size as those of Comparison Examples 1, 3 and 4, which had the same outer dimensions as Working Example, and the electrode thickness of the side-surface external electrodes 15 can be suppressed to have the same size as those of Comparison Examples 1, 3, and 4. Therefore, it was verified that in the multilayer ceramic capacitor 10 of Working Example, the side-surface external electrodes 15 can be formed thin and at the same time, the ESL value can be made small.

II. Embodiment 2

In Embodiment 1, a plurality of electrode covering regions 151 of the side-surface external electrode 15 are connected together via the connecting region 152 to form a unitary electrode. The present invention, however, is not limited to that configuration. A plurality of electrode covering regions may be separated from each other without being connected.

Figure 12:
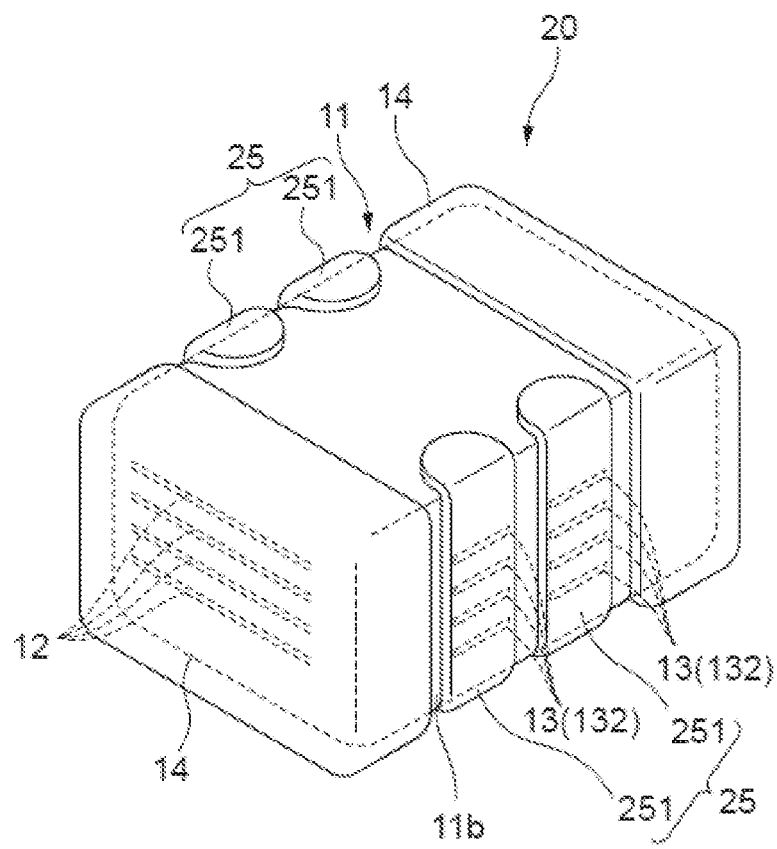
FIG. 12 is a perspective view of a multilayer ceramic capacitor according to Embodiment 2 of the present invention.
Figure 13:
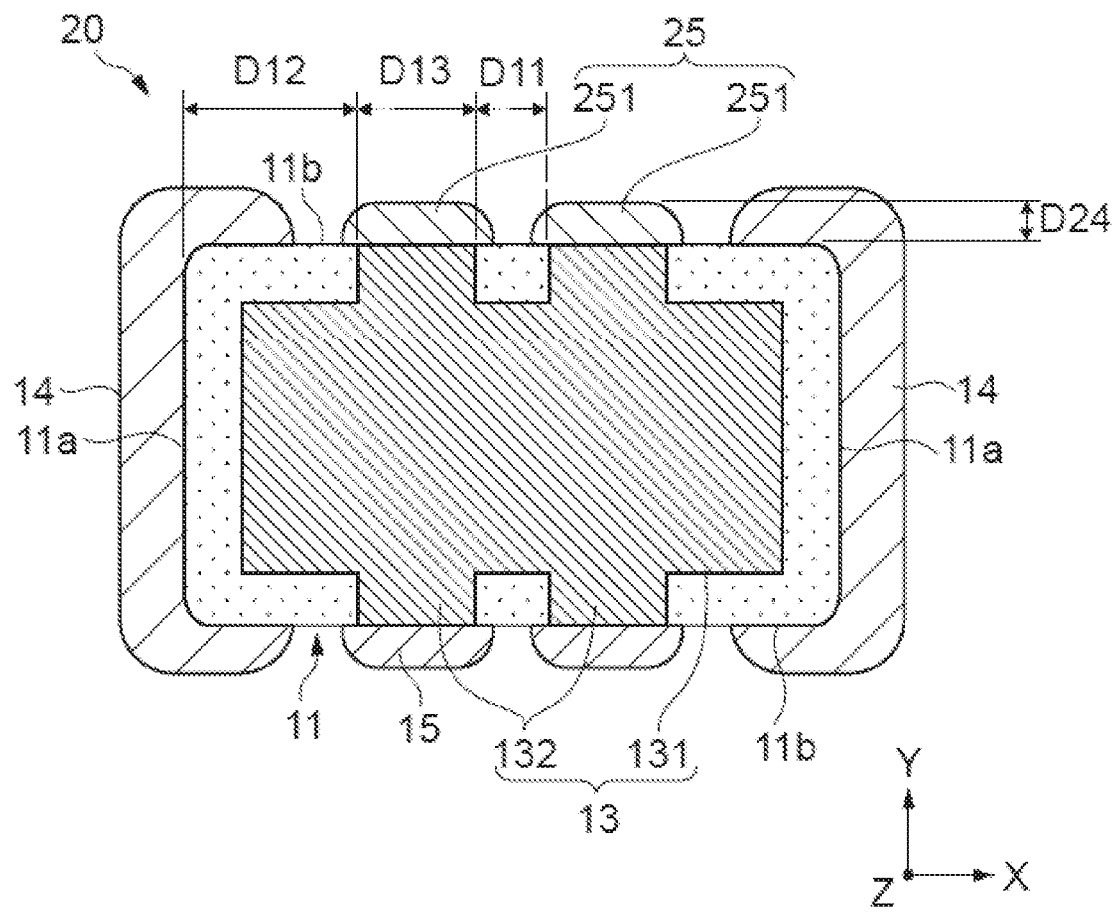
FIG. 13 is a cross-sectional view of the multilayer ceramic capacitor of Embodiment 2, cutting the second internal electrode by a plane parallel to the X-Y plane.

FIGS. 12 and 13 show a multilayer ceramic capacitor 20 according to Embodiment 2 of the present disclosure. FIG. 12 is a perspective view of the multilayer ceramic capacitor 20. FIG. 13 is a cross-sectional view of the multilayer ceramic capacitor 20, showing a cross section cutting the second internal electrode 13 by a plane parallel to the X-Y plane. In the descriptions provided below, elements that are the same as those of Embodiment 1 are assigned the same reference characters/numerals, and their explanations are omitted.

The multilayer ceramic capacitor 20 has a ceramic main body 11 and a pair of end-surface external electrodes 14 and a pair of side-surface electrodes 25. The structure of the side-surface external electrodes 25 of the multilayer ceramic capacitor 20 differs from that of Embodiment 1.

Each of the side-surface external electrodes 25 includes a plurality of electrode covering regions 251 that are separated along the X-direction and that respectively cover the exposed lateral edges of a plurality of drawn-out parts 132. Each of the electrode covering regions 251 covers a column of the exposed lateral edges of the drawn-out parts 132, and extends in the Z direction from one of the main surfaces 11c to the other of the main surfaces 11c through the side surface 11b. Each of the electrode covering regions 251 are formed by applying a conductive paste in a band shape pattern that extends in the Z-direction. Here, however, the conductive paste is applied such that the respective band-shaped patterns are separated from each other in the X-direction.

In the present embodiment, the second internal electrodes 13 are formed in the same manner as Embodiment 1. Because of this, the width D13 of the drawn-out parts 132 can be made narrow. Therefore, the degree of the bulging of conductive paste on the exposed lateral edges of the drawn-out parts 132 can be suppressed, and the electrode thickness D24 along the Y-axis of each electrode covering region 251 can be made small. Specifically, the electrode thickness D24 may be about the same as the electrode thickness D34 along the Y-axis of the side-surface external electrode 35 of Comparison Example 1, and is smaller than the electrode thickness D44 of the electrode covering region 451 of Comparison Example 2.

Therefore, in the multilayer ceramic capacitor 20, by providing a plurality of drawn-out parts 132 having a relatively small D13 that are separated from each other, the distance D13 from the end surface 11a to the drawn-out part 132 can be made small, and at the same time, the electrode thickness D24 of the electrode covering region 251 can be made small. Thus, the present embodiment can also provide a low ESL, miniaturized, and high-capacitance multilayer ceramic capacitor 20.

Figure 14:
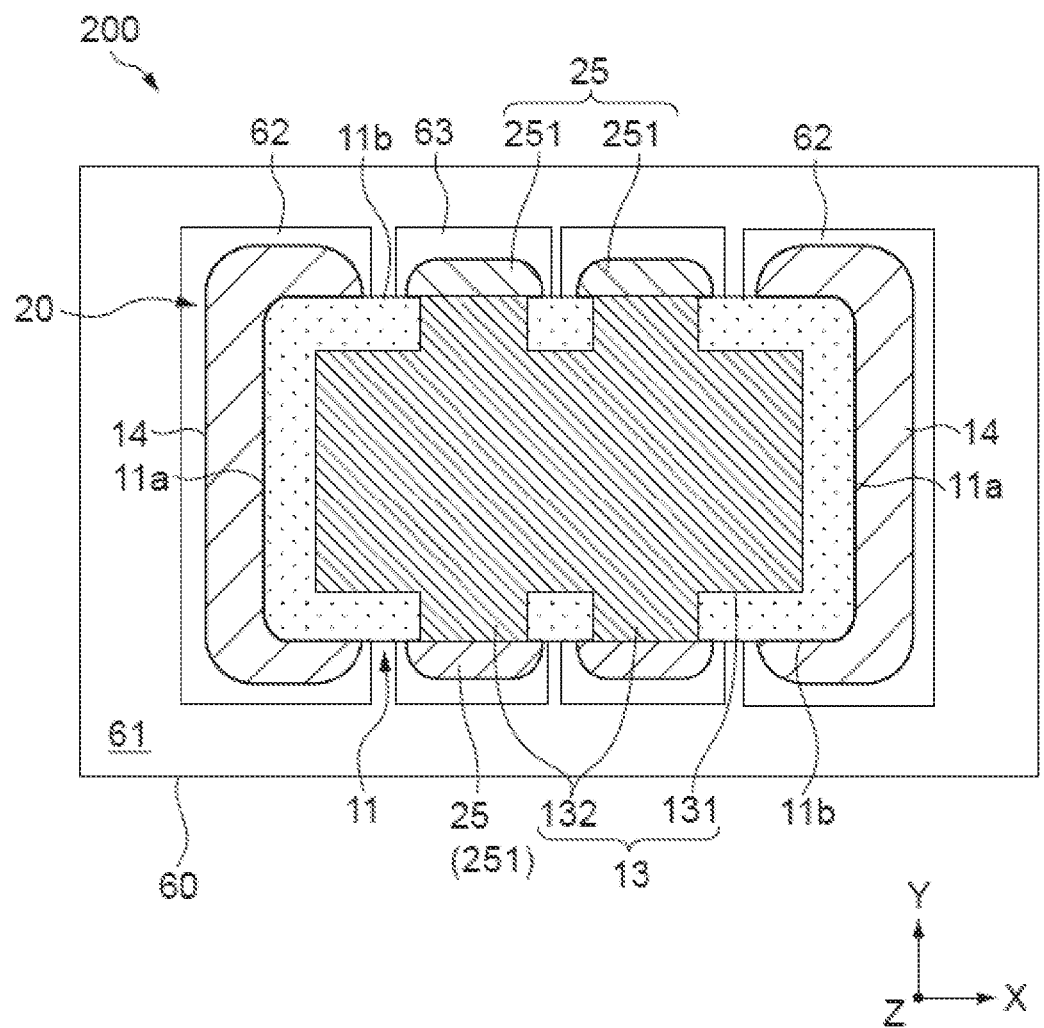
FIG. 14 shows a circuit substrate mounting the multilayer ceramic capacitor of Embodiment 2, showing a cross section at a position similar to FIG. 13.

FIG. 14 is a cross-sectional view of a circuit substrate 200 mounting thereon the multilayer ceramic capacitor 20 of the present embodiment, and shows a cross section in a position similar to FIG. 13. The circuit substrate 200 includes a mounting substrate 60 having a mounting surface 61 and the multilayer ceramic capacitor 20 mounted on the mounting surface 61.

The mounting surface 61 includes first lands 62 connected to the end-surface external electrodes 14, and second lands 63 connected to the side-surface external electrodes 25. In the example shown in FIG. 14, the mounting surface 61 has two first lands 62 and two second lands 63 for a single multilayer ceramic capacitor 20. The external electrodes 14 and 25 are respectively connected to the lands 62 and 63 via a solder, which is not shown in the figure.

Similar to the first land 52 of Embodiment 1, the first land 62 is provided for each of the pair of the end-surface external electrodes 14, and in a plan view as seen in the negative Z-direction, the first land 62 has a planar shape that is larger than a planar shape of the end-surface external electrode 14.

In the plan view as seen in the negative Z-direction, the second lands 63 each have a planar shape that covers the pair of electrode covering regions 251 that face each other along the Y-axis. That is, to each of the second lands 63, two electrode covering regions 251 that face each other along the Y-axis are connected. However, the present invention is not limited to such a configuration. For example, all four electrode covering regions 251 may be connected to a single land 63. Alternatively, four second lands 63 may be provided for a single multilayer ceramic capacitor 20, and one electrode covering region 251 may be connected to one corresponding second land 63.

In the circuit substrate 200 also, when voltage is applied to external electrodes 14 and 25 via the mounting substrate 60, the ESL generated in the multilayer ceramic capacitor 20 can be lowered. Furthermore, because the side-surface external electrodes 25 (electrode covering regions 251) can be made thin, in the circuit substrate 200, the static capacitance of the multilayer ceramic capacitor 20 can be increased without expanding the mounting space of the multilayer ceramic capacitor 20.

III. Other Embodiments

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

For example, although there are two drawn-out parts 132 for each of the side surfaces 11b of the ceramic body 11 above, there may be more than two drawn-out parts 132 for each of the side surfaces 11b. In such a case, the shape of the side-surface external electrodes are not particularly restricted. For example, a plurality of electrode covering regions may be connected via one or more connecting regions, or alternatively, a plurality of electrode covering regions may be separated from each other along the X-axis.

What is claimed is:

1. A multilayer ceramic capacitor, comprising:
a ceramic main body having a pair of end surfaces respectively facing a first direction and a direction opposite to the first direction and a pair of side surfaces respectively facing a second direction that is perpendicular to the first direction and a direction opposite to the second direction, the ceramic main body including first internal electrodes each drawn out to and reaching the pair of end surfaces and second internal electrodes each drawn out to and reaching the pair of side surfaces, the first internal electrodes and the second internal electrodes being laminated alternately in a third direction that is perpendicular to the first and second directions;
a pair of end-surface external electrodes respectively provided on the pair of end surfaces, the pair of end-surface external electrodes being each connected to the first internal electrodes; and
a pair of side-surface external electrodes respectively provided on the pair of side surfaces, the pair of side-surface external electrodes being each connected to the second internal electrodes,
wherein each of the second internal electrodes has an electrode main part that faces and overlaps with the first internal electrodes in the third direction, and drawn-out parts that extend from the electrode main part and reach the pair of side surfaces,
wherein in each of the second internal electrodes, with respect to each of the pair of side surfaces, two or more of the drawn-out parts are provided to extend from the electrode main part and reach the side surface,
wherein edges of the first internal electrodes are not exposed at the side surfaces of the ceramic main body and only edges of the drawn-out parts of the second internal electrodes are exposed at the side surfaces of the ceramic main body,
wherein each of the pair of side-surface external electrodes has electrode covering regions that respectively cover the plurality of drawn-out parts of the second internal electrodes and that are separated in the first direction and a connecting region on the corresponding side surface where the drawn-out parts are absent that connects the electrode covering regions that are adjacent to each other in the first direction, and
wherein in each of the pair of side-surface external electrodes, a thickness of the connecting region along the second direction at a center point between the electrode covering regions that are adjacent to each other in the first direction is less than a maximum thickness of the electrode covering regions along the second direction that are adjacent to each other in the first direction.

2. The multilayer ceramic capacitor according to claim 1, wherein in each of the second internal electrodes, with respect to each of the pair of side surfaces, only two of the drawn-out parts are provided to extend from the electrode main part and reach the side surface, and
wherein said two drawn-out parts are separated from each other in the first direction by 100 µm or more, a width of each of said two drawn-out parts exposed at the pair of side surfaces is equal to or less than 300 µm, and a lateral end of each of said two drawn-out parts exposed at the pair of side surfaces closest to one of the pair of the end surfaces is distanced from the end surface by 400 µm or less.

3. The multilayer ceramic capacitor according to claim 1, wherein each of the first internal electrodes is formed in a band shape spanning an entire dimension in the first direction of the ceramic main body.

4. The multilayer ceramic capacitor according to claim 1, wherein the ceramic main body includes ceramic layers respectively between the respective first internal electrodes and the respective second internal electrodes, and each of the ceramic layers includes barium titanate as a main component.

5. The multilayer ceramic capacitor according to claim 1, wherein the ceramic main body includes ceramic layers respectively between the respective first internal electrodes and the respective second internal electrodes, and each of the ceramic layers includes calcium titanate ($CaTiO_3$), calcium zirconate ($CaZrO_3$), calcium titanate zirconate ($Ca(Zr, Ti)O_3$), or barium zirconate ($BaZrO_3$), as a main component.

6. The multilayer ceramic capacitor according to claim 1, wherein in each of the second internal electrodes, with respect to each of the pair of side surfaces, two of the drawn-out parts are provided to extend from the electrode main part and reach the side surface, and wherein said two drawn-out parts are separated from each other in the first direction by 100 µm or more.

7. A circuit substrate, comprising:
a mounting substrate having a mounting surface;
a multilayer ceramic capacitor mounted on the mounting surface, the multilayer ceramic capacitor including:
   a ceramic main body having a pair of end surfaces respectively facing a first direction and a direction opposite to the first direction and a pair of side surfaces respectively facing a second direction that is perpendicular to the first direction and a direction opposite to the second direction, the ceramic main body including first internal electrodes each drawn out to and reaching the pair of end surfaces and second internal electrodes each drawn out to and reaching the pair of side surfaces, the first internal electrodes and the second internal electrodes being laminated alternately in a third direction that is perpendicular to the first and second directions;
   a pair of end-surface external electrodes respectively provided on the pair of end surfaces, the pair of end-surface external electrodes being each connected to the first internal electrodes; and
   a pair of side-surface external electrodes respectively provided on the pair of side surfaces, the pair of side-surface external electrodes being each connected to the second internal electrodes,
   wherein each of the second internal electrodes has an electrode main part that faces and overlaps with the first internal electrodes in the third direction, and drawn-out parts that extend from the electrode main part and reach the pair of side surfaces,
   wherein in each of the second internal electrodes, with respect to each of the pair of side surfaces, two or more of the drawn-out parts are provided to extend from the electrode main part and reach the side surface,
   wherein each of the first internal electrodes has no portion extending in the second direction or in the direction opposite to the second direction and reaching the side surfaces of the ceramic main body so that edges of the first internal electrodes are not exposed at the side surfaces and only edges of the drawn-out parts of the second internal electrodes are exposed at the side surfaces,
   wherein each of the pair of side-surface external electrodes has electrode covering regions that respectively cover the plurality of drawn-out parts of the second internal electrodes and that are separated in the first direction and a connecting region on the corresponding side surface where the drawn-out parts are absent that connects the electrode covering regions that are adjacent to each other in the first direction, and
   wherein in each of the pair of side-surface external electrodes, a thickness of the connecting region along the second direction at a center point between the electrode covering regions that are adjacent to each other in the first direction is less than a maximum thickness of the electrode covering regions along the second direction that are adjacent to each other in the first direction.

8. A method for manufacturing a multilayer ceramic capacitor, comprising:
forming a ceramic main body having a pair of end surfaces respectively facing a first direction and a direction opposite to the first direction and a pair of side surfaces respectively facing a second direction that is perpendicular to the first direction and a direction opposite to the second direction, the ceramic main body including first internal electrodes each drawn out to and reaching the pair of end surfaces and second internal electrodes each drawn out to and reaching the pair of side surfaces, the first internal electrodes and the second internal electrodes being laminated alternately in a third direction that is perpendicular to the first and second directions, wherein each of the second internal electrodes has an electrode main part that faces and overlaps with the first internal electrodes in the third direction, and drawn-out parts that extend from the electrode main part and reach the pair of side surfaces, and wherein in each of the second internal electrodes, with respect to each of the pair of side surfaces, two or more of the drawn-out parts are provided to extend from the electrode main part and reach the side surface;
forming a pair of end-surface external electrodes respectively on the pair of end surfaces by coating a conductive paste on each of the pair of end surfaces, the pair of end-surface external electrodes being each connected to the first internal electrodes; and
forming a pair of side-surface external electrodes respectively on the pair of side surfaces by coating a conductive paste on each of the pair of side surfaces, the pair of side-surface external electrodes being each connected to the plurality of drawn-out parts of the second internal electrodes,
wherein edges of the first internal electrodes are not exposed at the side surfaces of the ceramic main body and only edges of the drawn-out parts of the second internal electrodes are exposed at the side surfaces of the ceramic main body,
wherein each of the pair of side-surface external electrodes has electrode covering regions that respectively cover the plurality of drawn-out parts of the second internal electrodes and that are separated in the first direction and a connecting region on the corresponding side surface where the drawn-out parts are absent that connects the electrode covering regions that are adjacent to each other in the first direction, and
wherein in each of the pair of side-surface external electrodes, a thickness of the connecting region along the second direction at a center point between the electrode covering regions that are adjacent to each other in the first direction is less than a maximum thickness of the electrode covering regions along the second direction that are adjacent to each other in the first direction.

* * * * *